(12) United States Patent
Shi et al.

(10) Patent No.: US 9,589,995 B2
(45) Date of Patent: Mar. 7, 2017

(54) TFT SUBSTRATE HAVING THREE PARALLEL CAPACITORS

(71) Applicant: Shenzhen China Star Optoelectronics Technology Co., Ltd., Shenzhen, Guangdong (CN)

(72) Inventors: Longqiang Shi, Guangdong (CN); Chihyuan Tseng, Guangdong (CN); Wenhui Li, Guangdong (CN); Yutong Hu, Guangdong (CN); Hejing Zhang, Guangdong (CN); Xiaowen Lv, Guangdong (CN); Chihyu Su, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 253 days.

(21) Appl. No.: 14/384,661

(22) PCT Filed: Aug. 15, 2014

(86) PCT No.: PCT/CN2014/084448
§ 371 (c)(1),
(2) Date: Sep. 11, 2014

(87) PCT Pub. No.: WO2016/004668
PCT Pub. Date: Jan. 14, 2016

(65) Prior Publication Data
US 2016/0247837 A1     Aug. 25, 2016

(30) Foreign Application Priority Data
Jul. 11, 2014   (CN) .......................... 2014 1 0330710

(51) Int. Cl.
| H01L 27/12 | (2006.01) |
| H01L 27/32 | (2006.01) |
| H01L 29/24 | (2006.01) |
| H01L 29/786 | (2006.01) |

(52) U.S. Cl.
CPC ........ *H01L 27/1255* (2013.01); *H01L 27/127* (2013.01); *H01L 27/1225* (2013.01);
(Continued)

(58) Field of Classification Search
CPC ............. H01L 27/1255; H01L 27/1225; H01L 27/127; H01L 27/3262;
(Continued)

(56) References Cited

U.S. PATENT DOCUMENTS 6,569,717 B1 * 5/2003 Murade ............. G02F 1/136213
257/296
6,850,292 B1 * 2/2005 Murade ............. G02F 1/136209
349/44
(Continued)

FOREIGN PATENT DOCUMENTS

CN        1292100 A      4/2001

*Primary Examiner* — Kevin Parendo
(74) *Attorney, Agent, or Firm* — Andrew C. Cheng

(57) ABSTRACT

Disclosed are a method for manufacturing a TFT substrate having storage capacitors and the TFT substrate. The method includes: (1) forming a gate terminal and a first metal electrode; (2) forming a gate insulation layer and a gate insulation layer through-hole; (3) forming an oxide semiconductor layer; (4) subjecting a portion of the oxide semiconductor layer to N-type heavy doping to form a first conductor electrode thereby constituting a first storage capacitor; (5) forming an etch stop layer and a first etch stop layer through-hole; (6) forming source/drain terminals and a second metal electrode, thereby constituting a second storage capacitor connected in parallel to the first capacitor; (7) forming a protection layer, a protection layer through-hole, and a second etch stop layer through-hole; and (8) forming a pixel electrode and a second conductor electrode, thereby constituting a third storage capacitor connected in parallel to the second capacitor.

11 Claims, 5 Drawing Sheets

(52) U.S. Cl.
CPC .......... *H01L 29/24* (2013.01); *H01L 29/7869* (2013.01); *H01L 29/78606* (2013.01); *H01L 29/78618* (2013.01); *H01L 27/3262* (2013.01); *H01L 27/3265* (2013.01)

(58) Field of Classification Search
CPC ............................... H01L 27/12–27/13; H01L 29/66742–29/6678; H01L 29/786–29/78696
See application file for complete search history.

(56) References Cited

U.S. PATENT DOCUMENTS

| | | | |
|---|---|---|---|
| 2007/0176238 A1* | 8/2007 | Seacrist | H01L 21/02381 257/350 |
| 2008/0284935 A1* | 11/2008 | Takahashi | G02F 1/136286 349/46 |
| 2009/0059110 A1* | 3/2009 | Sasaki | G02F 1/134363 349/39 |
| 2010/0065842 A1* | 3/2010 | Yamazaki | H01L 27/1225 257/43 |
| 2014/0057402 A1* | 2/2014 | Guha | H01L 21/8222 438/237 |
| 2014/0183522 A1* | 7/2014 | Cha | H01L 29/66969 257/43 |
| 2014/0197489 A1* | 7/2014 | Chu | H01L 29/7816 257/343 |
| 2014/0291636 A1* | 10/2014 | Kim | H01L 27/3262 257/40 |
| 2015/0243722 A1* | 8/2015 | Kwon | H01L 27/3262 257/40 |

* cited by examiner

TFT SUBSTRATE HAVING THREE PARALLEL CAPACITORS

BACKGROUND OF THE INVENTION

1. Field of the Invention

The present invention relates to the field of displaying technology, and in particular to a method for manufacturing a TFT (Thin-Film Transistor) substrate having storage capacitors and the TFT substrate.

2. The Related Arts

Flat panel displays have a variety of advantages, such as thin device body, low power consumption, and being free of radiation, and are thus widely used. Currently available flat panel displays generally include liquid crystal displays (LCDs) and organic light emitting displays (OLEDs)

Organic light emitting displays (OLEDs) have a variety of superior properties, such as being self-luminous, requiring no backlighting, high contrast, reduced thickness, wide view angle, fast response, applicability to flexible panels, wide range of operation temperature, and having simple structure and manufacturing process, and are regarded as emerging technology of the next generation of the flat panel displays.

In the manufacture of OLED panels, oxide semiconductors have been widely used due to having relatively high electron mobility and, compared to low-temperature polysilicon, the oxide semiconductors having a simple manufacturing process and being of high compatibility to amorphous silicon manufacturing process, and also being compatible to high generation manufacturing lines.

OLED can be classified, according to the way of driving, into passive OLED (PM-OLED) and active OLED (AM-OLED).

A conventional AM-OLED device is generally made up of two transistors between which a storage capacitor is formed, of which an equivalent circuit is shown in FIG. 1, wherein a storage capacitor Cst is formed between a the thin-film transistor T1 and a thin-film transistor T2. The thin-film transistors T1, T2 are both field effect transistors. The thin-film transistor T1 serves as a signal switching transistor, which functions for supplying and cutting off a data signal. The thin-film transistor T2 serves as a driving transistor, which is connected to an organic light-emitting diode D. The storage capacitor Cst is generally composed of a gate terminal metal, a source/drain terminal metal, and an insulation layer interposed therebetween or a source/drain terminal metal, a pixel electrode, and an insulation layer interposed therebetween. Specifically, the signal switching transistor T1 has a gate terminal that receives a scan signal Vgate and a source terminal that receives a data signal Vdata, and a drain terminal connected to a gate terminal of the driving transistor T2. The driving transistor T2 has a source terminal connected to a power supply Vdd, a drain terminal connected to an anode of the organic light-emitting diode D. A cathode of the organic light-emitting diode D is connected to ground Vss. The storage capacitor Cst is connected between the drain terminal of the signal switching transistor T1 and the source terminal of the driving transistor T2.

The principle of the operation of the circuit is that when the scan signal Vgate is supplied, the signal switching transistor T1 is conducted and the data signal Vdata is fed to the gate terminal of the driving transistor T2 and amplified by the driving transistor T2 to drive the organic light-emitting diode D for performing displaying. When the scan signal is ended, the storage capacitor Cst serves as a major measure to maintain the potential level of the pixel electrode and a unified and expanded storage capacitor can effectively improve homogeneity of the displayed image and enhance the displaying quality. A measure for expanding the storage capacitor Cst generally involves two ways of either expanding the surface area of electrode plates or reducing the distance between two electrode plates. However, expanding the surface area of Cst would result in reduction of the area of the aperture zone, leading to reduction of aperture ratio and reduction of displaying brightness; and simply reducing the distance between two electrode plates would pose a potential issue of breaking through, leading to a risk of damaging the AM-OLED.

SUMMARY OF THE INVENTION

An object of the present invention is to provide a method for manufacturing a TFT (Thin-Film Transistor) substrate having storage capacitors, which increases the storage capacitance and improves circuit performance and wherein the storage capacitors occupy a reduced area so that the area of an aperture zone is increased, the aperture ratio increased, and the displaying performance is enhanced.

Another object of the present invention is to provide a TFT substrate, which has storage capacitors that are increased, occupy a reduced area, helps increase aperture ratio, and enhances displaying performance.

To achieve the above object, the present invention provides a method for manufacturing a thin-film transistor (TFT) substrate having storage capacitors, comprising the following steps:

(1) providing a substrate and depositing and patterning a first metal layer on the substrate so as to form a gate terminal and simultaneously form a first metal electrode;

(2) depositing and patterning a gate insulation layer on the gate terminal, the first metal electrode, and the substrate so as to form a gate insulation layer through-hole;

(3) depositing and patterning an oxide semiconductor layer on the gate insulation layer;

(4) subjecting the portion of the oxide semiconductor layer that is set on and covers the portion of the gate insulation layer that is located on the first metal electrode to N-type heavy doping so as to form a first conductor electrode, wherein the first metal electrode, the first conductor electrode, and the gate insulation layer interposed therebetween constitute a first storage capacitor C1;

(5) depositing and patterning an etch stop layer on the first conductor electrode, the oxide semiconductor layer, and the gate insulation layer so as to form a first etch stop layer through-hole in communication with the gate insulation layer through-hole;

(6) depositing and patterning a second metal layer on the etch stop layer so as to form source/drain terminals and simultaneously form a second metal electrode, wherein the first conductor electrode, the second metal electrode, and the etch stop layer interposed therebetween constitute a second storage capacitor C2 and the second metal electrode fills up the first etch stop layer through-hole and the gate insulation layer through-hole and is connected to the first metal electrode to thereby connect the second storage capacitor C2 in parallel to the first storage capacitor C1;

(7) depositing and patterning a protection layer on the source/drain terminals, the second metal electrode, and the etch stop layer so as to form a protection layer through-hole and a second etch stop layer through-hole in communication therewith; and (8) depositing and patterning a pixel electrode layer on the protection layer so as to form a pixel electrode and simultaneously form a second conductor electrode, wherein the second metal electrode, the second conductor electrode, and the protection layer interposed therebetween constitute a third storage capacitor C3 and the second conductor electrode fills up the protection layer through-hole and the second etch stop layer through-hole and is connected to the first conductor electrode to thereby connect the third storage capacitor C3 in parallel to the second storage capacitor C2.

The oxide semiconductor layer comprises an IGZO oxide semiconductor layer and the first conductor electrode comprises an N+IGZO conductor electrode.

The second conductor electrode comprises an ITO conductor electrode or an IZO conductor electrode and the pixel electrode is an ITO pixel electrode or an IZO pixel electrode.

The first metal layer, the oxide semiconductor layer, the second metal layer, and the pixel electrode layer are deposited by applying physical vapor deposition and the gate insulation layer, the etch stop layer, and the protection layer are deposited by applying chemical vapor deposition.

The gate insulation layer is deposited by applying plasma-enhanced chemical vapor deposition.

Step (1) uses photolithography, wet etching, and stripper operations to patternize the first metal layer so as to form the gate terminal and simultaneously form the first metal electrode. Step (2) uses photolithography, dry etching, and stripper operations to patternize the gate insulation layer so as to form the gate insulation layer through-hole. Step (3) uses photolithography, wet etching, and stripper operations to patternize the oxide semiconductor layer. Step (5) uses photolithography, dry etching, and stripper operations to patternize the etch stop layer so as to form the first etch stop layer through-hole. Step (6) uses photolithography, wet etching, and stripper operations to patternize the second metal layer so as to form the source/drain terminals and simultaneously form the second metal electrode. Step (7) uses photolithography, dry etching, and stripper operations to patternize the protection layer so as to form the protection layer through-hole and the second etch stop layer through-hole in communication therewith. Step (9) uses photolithography, wet etching, and stripper operations to patternize the pixel electrode layer so as to form the pixel electrode and simultaneously form the second conductor electrode.

Step (4) uses photolithography, hydrogen plasma treatment, and stripper operations to carry out the N-type doping of the portion of the oxide semiconductor layer that is set on and covers the portion of the gate insulation layer that is located on the first metal electrode so as to form the first conductor electrode.

The present invention also provides a TFT substrate, which comprises a substrate, a first metal electrode arranged on the substrate, a gate insulation layer arrange don the first metal electrode, a first conductor electrode arranged on the gate insulation layer, an etch stop layer arranged on the first conductor electrode, a second metal electrode arranged on the etch stop layer, a protection layer arranged on the second metal electrode, and a second conductor electrode arranged on the protection layer, wherein the first metal electrode, the first conductor electrode, and the gate insulation layer interposed therebetween constitute a first storage capacitor C1; the first conductor electrode, the second metal electrode, and the etch stop layer interposed therebetween constitute a second storage capacitor C2; and the second metal electrode, the second conductor electrode, and the protection layer interposed therebetween constitute a third storage capacitor C3; the gate insulation layer comprises a gate insulation layer through-hole; the etch stop layer comprises a first etch stop layer through-hole and a second etch stop layer through-hole; the protection layer comprises a protection layer through-hole; the first etch stop layer through-hole is connected to and in communication with the gate insulation layer through-hole; the protection layer through-hole is connected to and in communication with the second etch stop layer through-hole; the second metal electrode fills up the first etch stop layer through-hole and the gate insulation layer through-hole and is connected to the first metal electrode so as to connect the second storage capacitor C2 in parallel to the first storage capacitor C1; and the second conductor electrode fills up the protection layer through-hole and the second etch stop layer through-hole and is connected to the first conductor electrode so as to connect the third storage capacitor C3 in parallel to the second storage capacitor C2.

The first conductor electrode comprises an N+IGZO conductor electrode and the second conductor electrode comprises ITO conductor electrode or an IZO conductor electrode.

The TFT substrate further comprises: a gate terminal that is located on the same layer as the first metal electrode, an oxide semiconductor layer that is located on the same layer as the first conductor electrode, source/drain terminals that are located on the same layer as the second metal electrode, and a pixel electrode that is located on the same layer as the second conductor electrode; the source/drain terminals are connected to the oxide semiconductor layer; the oxide semiconductor layer comprises an IGZO oxide semiconductor layer and the pixel electrode comprise san ITO pixel electrode or an IZO pixel electrode.

The efficacy of the present invention is that the present invention provides a method for manufacturing a TFT substrate having storage capacitors, wherein a first metal electrode, a first conductor electrode, and a gate insulation layer interposed therebetween are made to constitute a first storage capacitor C1; the first conductor electrode, a second metal electrode, and an etch stop layer interposed therebetween are made to constitute a second storage capacitor C2; the second metal electrode, a second conductor electrode, and a protection layer interposed therebetween are made to constitute a third storage capacitor C3 and the first, second, and third storage capacitors C1, C2, C3 are connected to each other in parallel so that storage capacitance is increased, circuit performance can be improved, the area occupied by the storage capacitors is made smaller thereby increasing the area of the aperture zone, increasing the aperture ratio, and improving displaying performance. The present invention provides a TFT substrate, which comprises three parallel-connected first, second, and third storage capacitors C1, C2, C3 so as to make storage capacitance increased and occupied area reduced thereby helping increasing aperture ratio and improving displaying performance.

BRIEF DESCRIPTION OF THE DRAWINGS

The technical solution, as well as beneficial advantages, of the present invention will be apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
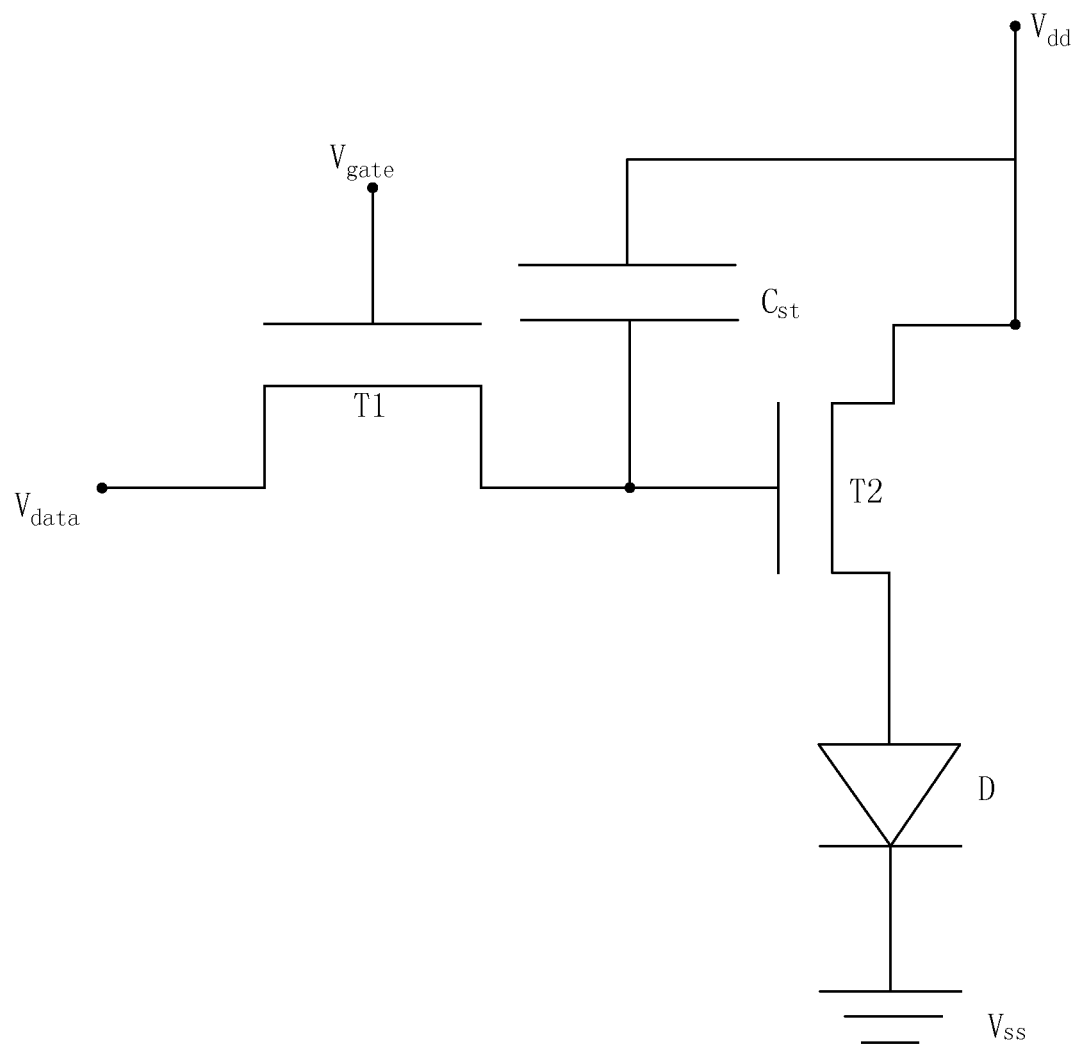
FIG. 1 is an equivalent circuit diagram of a convention AM-OLED device.
Figure 2:
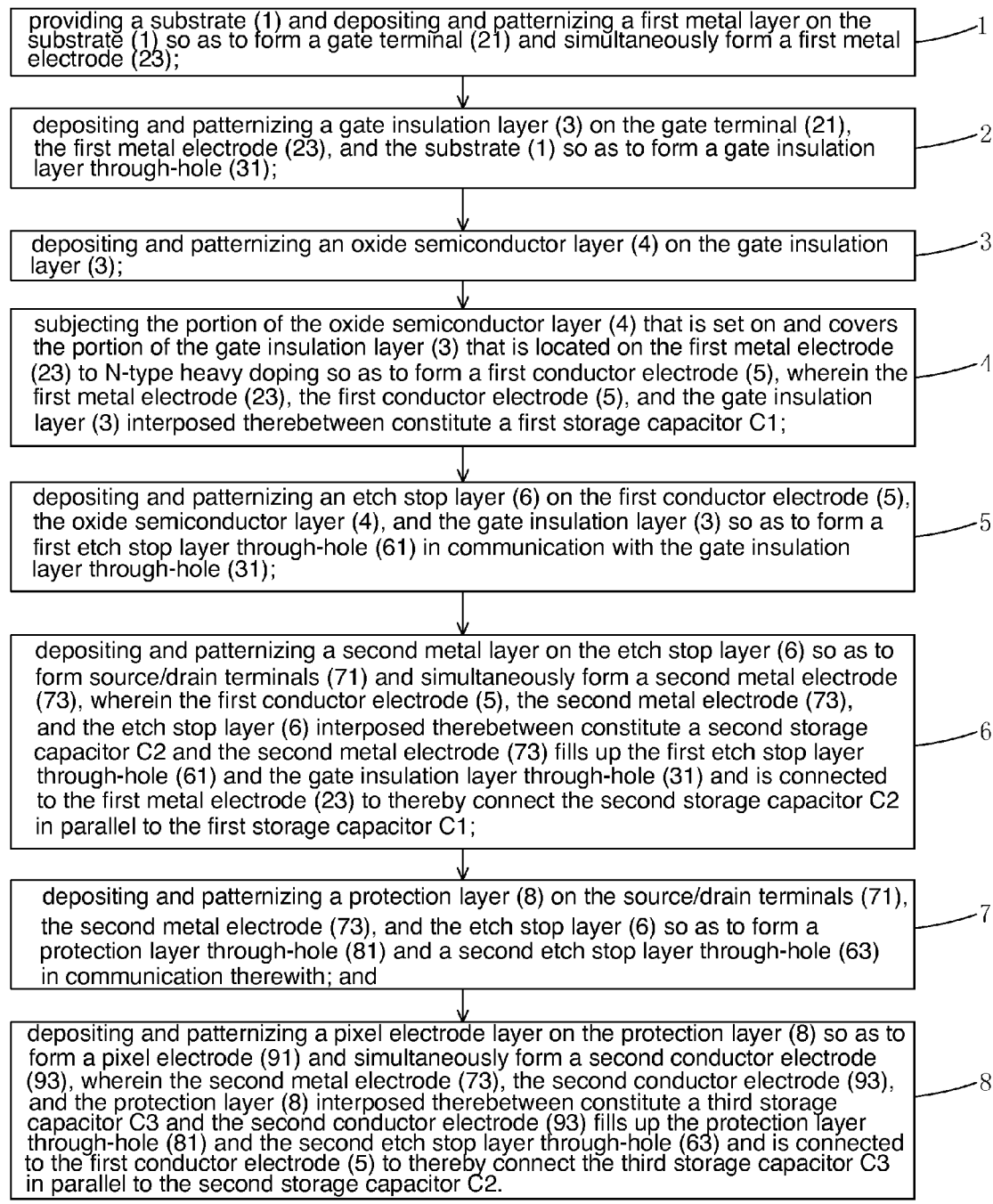
FIG. 2 is a flow chart illustrating a method for manufacturing a TFT substrate having storage capacitors according to the present invention.
Figure 3:
FIG. 3 is a schematic view showing step 1 of the method for manufacturing a TFT substrate having storage capacitors according to the present invention.

Referring to FIG. 2, the present invention provides a method for manufacturing a TFT substrate having storage capacitors, which comprises the following steps:

Step 1: referring to FIG. 3, providing a substrate 1 and applying physical vapor deposition (PVD) to deposit a first metal layer on the substrate 1, and applying photolithography, wet etching, and stripper operations to patternize the first metal layer so as to form a gate terminal 21 and simultaneously form a first metal electrode 23.

The gate terminal 21 and the first metal electrode 23 are spaced from each other by a predetermined distance.

Figure 4:
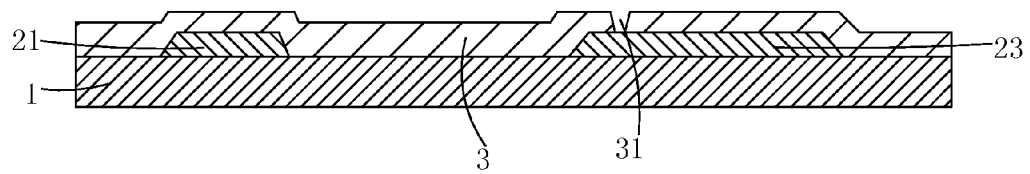
FIG. 4 is a schematic view showing step 2 of the method for manufacturing a TFT substrate having storage capacitors according to the present invention.

Step 2: referring to FIG. 4, applying plasma-enhanced chemical vapor deposition (PECVD) to deposit a gate insulation layer 3 on the gate terminal 21, the first metal electrode 23, and the substrate 1, and applying photolithography, dry etching, and stripper operations to patternize the gate insulation layer 3 to form a gate insulation layer through-hole 31 so as to expose a portion of the first metal electrode 23 located under the gate insulation layer through-hole 31.

The gate insulation layer through-hole 31 is located at one side of the first metal electrode 23.

Figure 5:
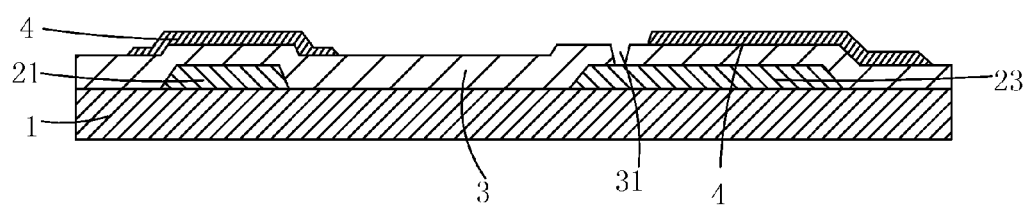
FIG. 5 is a schematic view showing step 3 of the method for manufacturing a TFT substrate having storage capacitors according to the present invention.

Step 3: referring to FIG. 5, applying PVD to deposit an oxide semiconductor layer 4 on the gate insulation layer 3, applying photolithography, wet etching, and stripper operations to patternize the oxide semiconductor layer (4).

After the completion of Step 3, a portion of the oxide semiconductor layer 4 is set on and covers a portion of the gate insulation layer 3 that is located on the gate terminal 21 and a portion of the oxide semiconductor layer 4 is set on and covers a portion of the gate insulation layer 3 that is located on the first metal electrode 23.

Figure 6:
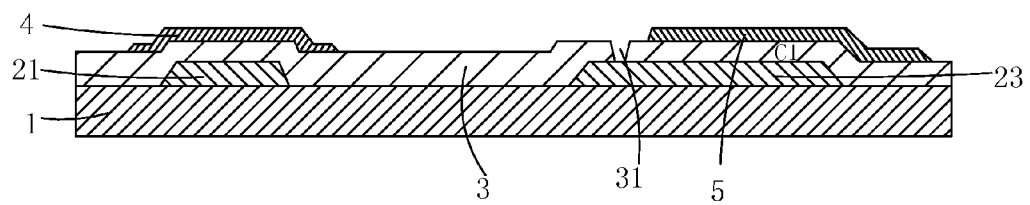
FIG. 6 is a schematic view showing step 4 of the method for manufacturing a TFT substrate having storage capacitors according to the present invention.

Step 4: referring to FIG. 6, subjecting the portion of the oxide semiconductor layer 4 that is set on and covers the portion of the gate insulation layer 3 that is located on the first metal electrode 23 to N-type heavy doping to improve electrical conductive property thereof so as to form a first conductor electrode 5.

Specifically, photolithography, hydrogen plasma treatment, and stripper operations are applied to carry out the N-type heavy doping of the portion of the oxide semiconductor layer 4 that is set on and covers the portion of the gate insulation layer 3 that is located on the first metal electrode 23.

To this point, the first metal electrode 23, the first conductor electrode 5, and the gate insulation layer 3 interposed therebetween constitute a first storage capacitor C1.

Figure 7:
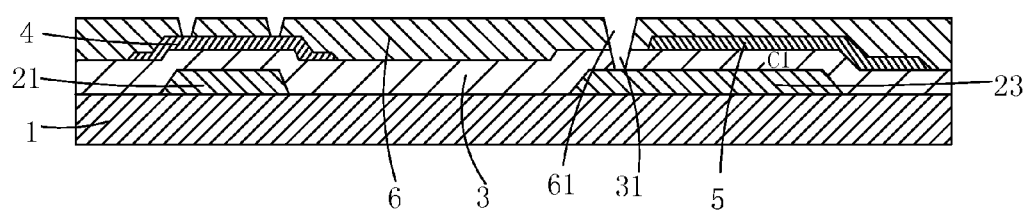
FIG. 7 is a schematic view showing step 5 of the method for manufacturing a TFT substrate having storage capacitors according to the present invention.

Step 5: referring to FIG. 7, applying chemical vapor deposition (CVD) to deposit an etch stop layer 6 on the first conductor electrode 5, the oxide semiconductor layer 4, and the gate insulation layer 3 and applying photolithography, dry etching, and stripper operations to patternize the etch stop layer 6 so as to form a first etch stop layer through-hole 61.

The first etch stop layer through-hole 61 is connected to and in communication with the gate insulation layer through-hole 31.

Figure 8:
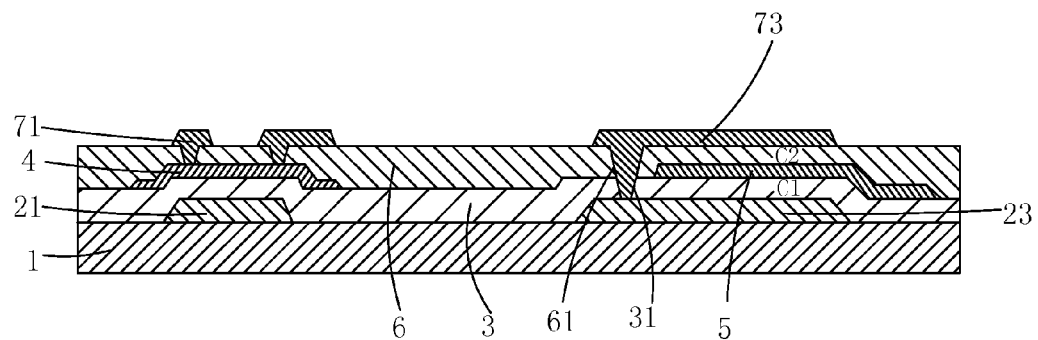
FIG. 8 is a schematic view showing step 6 of the method for manufacturing a TFT substrate having storage capacitors according to the present invention.

Step 6: referring to FIG. 8, applying PVD to deposit a second metal layer on the etch stop layer 6 and applying photolithography, wet etching, and stripper operations to patternize the second metal layer so as to form source/drain terminals 71 and simultaneously form a second metal electrode 73.

To this point, the first conductor electrode 5, the second metal electrode 73, and the etch stop layer 6 interposed therebetween constitute a second storage capacitor C2 and the second metal electrode 73 fills up the first etch stop layer through-hole 61 and the gate insulation layer through-hole 31 and is connected to the first metal electrode 23 to thereby connect the second storage capacitor C2 in parallel to the first storage capacitor C1.

Figure 9:
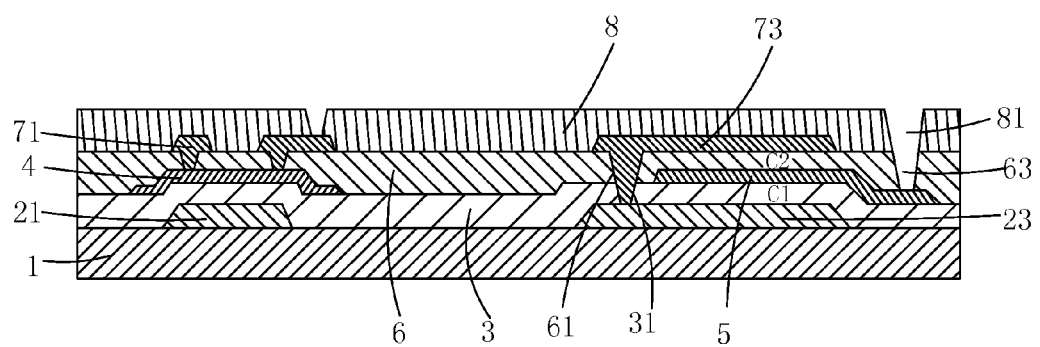
FIG. 9 is a schematic view showing step 7 of the method for manufacturing a TFT substrate having storage capacitors according to the present invention.

Step 7: referring to FIG. 9, applying CVD to deposit a protection layer 8 on the source/drain terminals 71, the second metal electrode 73, and the etch stop layer 6 and applying photolithography, dry etching, and stripper operations to patternize the protection layer 8 to form a protection layer through-hole 81 and a second etch stop layer through-hole 63 connected thereto and in communication therewith so as to expose the portion of the first conductor electrode 5 located under the second etch stop layer through-hole 63.

The protection layer through-hole 81 and the second etch stop layer through-hole 63 that is connected thereto and in communication therewith are located at an opposite side of the first metal electrode 23.

Figure 10:
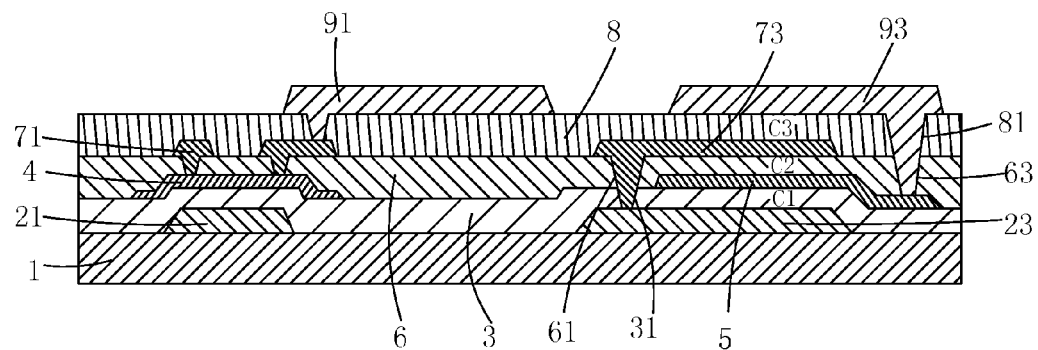
FIG. 10 is a schematic view showing step 8 of the method for manufacturing a TFT substrate having storage capacitors according to the present invention and a TFT substrate according to the present invention.

Step 8: referring to FIG. 10, applying PVD to deposit a pixel electrode layer on the protection layer 8 and applying photolithography, wet etching, and stripper operations to patternize the pixel electrode layer so as to form a pixel electrode 91 and simultaneously form a second conductor electrode 93.

To this point, the second metal electrode 73, the second conductor electrode 93, and the protection layer 8 interposed therebetween constitute a third storage capacitor C3 and the second conductor electrode 93 fills up the protection layer through-hole 81 and the second etch stop layer through-hole 63 and is connected to the first conductor electrode 5 so as to connect the third storage capacitor C3 in parallel to the second storage capacitor C2.

Figure 11:
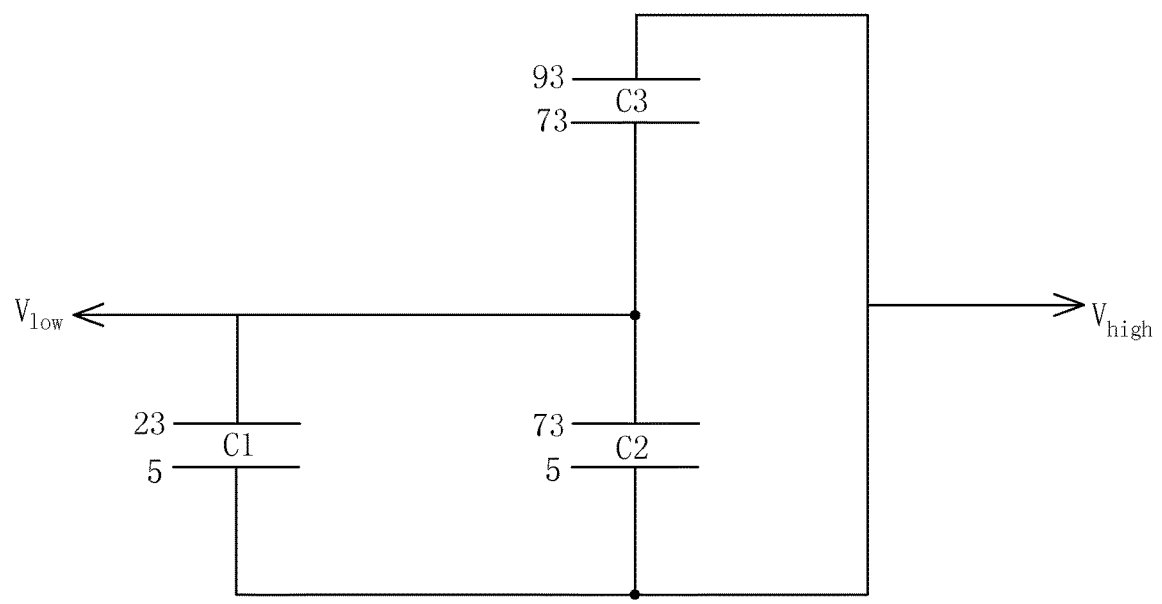
FIG. 11 is an equivalent circuit diagram of storage capacitors manufactured with the method for manufacturing a TFT substrate having storage capacitors according to the present invention.

Referring to FIG. 11, after completion of Step 8, the first, second, and third storage capacitors C1, C2, C3 are connected to each other in parallel so that it is possible to increase storage capacitance within a relatively small surface area, improve circuit performance, expand the area of aperture zone, increase the aperture ratio, and enhance displaying performance.

Referring to FIG. 10, the present invention also provides a TFT substrate that is manufactured with such a method and comprises a substrate 1, a first metal electrode 23 arranged on the substrate 1, a gate insulation layer 3 arrange don the first metal electrode 23, a first conductor electrode 5 arranged on the gate insulation layer 3, an etch stop layer 6 arranged on the first conductor electrode 5, a second metal electrode 73 arranged on the etch stop layer 6, a protection layer 8 arranged on the second metal electrode 73, and a second conductor electrode 93 arranged on the protection layer 8.

The first metal electrode 23, the first conductor electrode 5, and the gate insulation layer 3 interposed therebetween constitute a first storage capacitor C1. The first conductor electrode 5, the second metal electrode 73, and the etch stop layer 6 interposed therebetween constitute a second storage capacitor C2. The second metal electrode 73, the second conductor electrode 93, and the protection layer 8 interposed therebetween constitute a third storage capacitor C3.

The gate insulation layer 3 comprises a gate insulation layer through-hole 31. The etch stop layer 6 comprises a first etch stop layer through-hole 61 and a second etch stop layer through-hole 63. The protection layer 8 comprises a protection layer through-hole 81. The first etch stop layer through-hole 61 is connected to and in communication with the gate insulation layer through-hole 31. The protection layer through-hole 81 is connected to and in communication with the second etch stop layer through-hole 63. The first etch stop layer through-hole 61 and the gate insulation layer through-hole 31 are located at one side of the first metal electrode 23 and the protection layer through-hole 81 and the second etch stop layer through-hole 63 are located at an opposite side of the first metal electrode 23. The second metal electrode 73 fills up the first etch stop layer through-hole 61 and the gate insulation layer through-hole 31 and is connected to the first metal electrode 23 so as to connect the second storage capacitor C2 in parallel to the first storage capacitor C1; the second conductor electrode 93 fills up the protection layer through-hole 81 and the second etch stop layer through-hole 63 and is connected to the first conductor electrode 5 so as to connect the third storage capacitor C3 in parallel to the second storage capacitor C2. In other words, the first, second, and third storage capacitors C1, C2, C3 are connected to each other in parallel so as make the storage capacitance large and the occupied area small thereby helping increase aperture ratio and improve displaying performance.

The TFT substrate further comprises: a gate terminal 21 that is located on the same layer as the first metal electrode 23, an oxide semiconductor layer 4 that is located on the same layer as the first conductor electrode 5, source/drain terminals 71 that are located on the same layer as the second metal electrode 73, and a pixel electrode 91 that is located on the same layer as the second conductor electrode 93. The source/drain terminals 71 are connected to the oxide semiconductor layer 4. The first metal electrode 23 and the gate terminal 21 are formed simultaneously. The first conductor electrode 5 is formed by subjecting the semiconductor layer 4 to N-type heavy doping. The second conductor electrode 93 and the pixel electrode 91 are formed simultaneously.

Further, the oxide semiconductor layer 4 comprises an IGZO (Indium Gallium Zinc Oxide) oxide semiconductor layer. The pixel electrode 91 comprises an ITO (Indium Tin Oxide) pixel electrode or an IZO (Indium Zinc Oxide) pixel electrode. Correspondingly, the first conductor electrode 5 comprises an N+IGZO conductor electrode and the second conductor electrode 93 comprises an ITO conductor electrode or an IZO conductor electrode.

In summary, the present invention provides a method for manufacturing a TFT substrate having storage capacitors, wherein a first metal electrode, a first conductor electrode, and a gate insulation layer interposed therebetween are made to constitute a first storage capacitor C1; the first conductor electrode, a second metal electrode, and an etch stop layer interposed therebetween are made to constitute a second storage capacitor C2; the second metal electrode, a second conductor electrode, and a protection layer interposed therebetween are made to constitute a third storage capacitor C3 and the first, second, and third storage capacitors C1, C2, C3 are connected to each other in parallel so that storage capacitance is increased, circuit performance can be improved, the area occupied by the storage capacitors is made smaller thereby increasing the area of the aperture zone, increasing the aperture ratio, and improving displaying performance. The present invention provides a TFT substrate, which comprises three parallel-connected first, second, and third storage capacitors C1, C2, C3 so as to make storage capacitance increased and occupied area reduced thereby helping increasing aperture ratio and improving displaying performance.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor (TFT) substrate having storage capacitors, comprising the following steps:
   (1) providing a substrate and depositing and patterning a first metal layer on the substrate so as to form a gate terminal and simultaneously form a first metal electrode;
   (2) depositing and patterning a gate insulation layer on the gate terminal, the first metal electrode, and the substrate so as to form a gate insulation layer through-hole;
   (3) depositing and patterning an oxide semiconductor layer on the gate insulation layer;
   (4) subjecting the portion of the oxide semiconductor layer that is set on and covers the portion of the gate insulation layer that is located on the first metal electrode to N-type doping so as to form a first conductor electrode, wherein the first metal electrode, the first conductor electrode, and the gate insulation layer interposed therebetween constitute a first storage capacitor C1;
   (5) depositing and patterning an etch stop layer on the first conductor electrode, the oxide semiconductor layer, and the gate insulation layer so as to form a first etch stop layer through-hole in communication with the gate insulation layer through-hole;

(6) depositing and patternizing a second metal layer on the etch stop layer so as to form source/drain terminals and simultaneously form a second metal electrode, wherein the first conductor electrode, the second metal electrode, and the etch stop layer interposed therebetween constitute a second storage capacitor C2 and the second metal electrode fills up the first etch stop layer through-hole and the gate insulation layer through-hole and is connected to the first metal electrode to thereby connect the second storage capacitor C2 in parallel to the first storage capacitor C1, wherein the first and second storage capacitors each comprise an electrode formed of a metal and an opposite electrode formed of an N type doped oxide semiconductor;

(7) depositing and patternizing a protection layer on the source/drain terminals, the second metal electrode, and the etch stop layer so as to form a protection layer through-hole and a second etch stop layer through-hole in communication therewith; and (8) depositing and patternizing a pixel electrode layer on the protection layer so as to form a pixel electrode and simultaneously form a second conductor electrode, wherein the second metal electrode, the second conductor electrode, and the protection layer interposed therebetween constitute a third storage capacitor C3 and the second conductor electrode fills up the protection layer through-hole and the second etch stop layer through-hole and is connected to the first conductor electrode to thereby connect the third storage capacitor C3 in parallel to the second storage capacitor C2.

2. The method for manufacturing a TFT substrate having storage capacitors as claimed in claim 1, wherein the oxide semiconductor layer comprises an indium gallium zinc oxide (IGZO) oxide semiconductor layer and the first conductor electrode comprises an N type doped IGZO conductor electrode.

3. The method for manufacturing a TFT substrate having storage capacitors as claimed in claim 1, wherein the second conductor electrode comprises an indium tin oxide (ITO) conductor electrode or an indium zinc oxide (IZO) conductor electrode and the pixel electrode is an ITO pixel electrode or an IZO pixel electrode.

4. The method for manufacturing a TFT substrate having storage capacitors as claimed in claim 1, wherein the first metal layer, the oxide semiconductor layer, the second metal layer, and the pixel electrode layer are deposited by applying physical vapor deposition and the gate insulation layer, the etch stop layer, and the protection layer are deposited by applying chemical vapor deposition.

5. The method for manufacturing a TFT substrate having storage capacitors as claimed in claim 4, wherein the gate insulation layer is deposited by applying plasma-enhanced chemical vapor deposition.

6. The method for manufacturing a TFT substrate having storage capacitors as claimed in claim 1, wherein step (1) uses photolithography, wet etching, and stripper operations to patternize the first metal layer so as to form the gate terminal and simultaneously form the first metal electrode; step (2) uses photolithography, dry etching, and stripper operations to patternize the gate insulation layer so as to form the gate insulation layer through-hole; step (3) uses photolithography, wet etching, and stripper operations to patternize the oxide semiconductor layer; step (5) uses photolithography, dry etching, and stripper operations to patternize the etch stop layer so as to form the first etch stop layer through-hole; step (6) uses photolithography, wet etching, and stripper operations to patternize the second metal layer so as to form the source/drain terminals and simultaneously form the second metal electrode; step (7) uses photolithography, dry etching, and stripper operations to patternize the protection layer so as to form the protection layer through-hole and the second etch stop layer through-hole in communication therewith; and step (9) uses photolithography, wet etching, and stripper operations to patternize the pixel electrode layer so as to form the pixel electrode and simultaneously form the second conductor electrode.

7. The method for manufacturing a TFT substrate having storage capacitors as claimed in claim 1, wherein step (4) uses photolithography, hydrogen plasma treatment, and stripper operations to carry out the N-type doping of the portion of the oxide semiconductor layer that is set on and covers the portion of the gate insulation layer that is located on the first metal electrode so as to form the first conductor electrode.

8. A thin-film transistor (TFT) substrate, comprising a substrate, a first metal electrode arranged on the substrate, a gate insulation layer arranged on the first metal electrode, a first conductor electrode formed of an N type doped oxide semiconductor and arranged on the gate insulation layer, an etch stop layer arranged on the first conductor electrode, a second metal electrode arranged on the etch stop layer, a protection layer arranged on the second metal electrode, and a second conductor electrode arranged on the protection layer, wherein the first metal electrode, the first conductor electrode, and the gate insulation layer interposed therebetween constitute a first storage capacitor C1; the first conductor electrode, the second metal electrode, and the etch stop layer interposed therebetween constitute a second storage capacitor C2; and the second metal electrode, the second conductor electrode, and the protection layer interposed therebetween constitute a third storage capacitor C3; the gate insulation layer comprises a gate insulation layer through-hole; the etch stop layer comprises a first etch stop layer through-hole and a second etch stop layer through-hole; the protection layer comprises a protection layer through-hole; the first etch stop layer through-hole is connected to and in communication with the gate insulation layer through-hole; the protection layer through-hole is connected to and in communication with the second etch stop layer through-hole; the second metal electrode fills up the first etch stop layer through-hole and the gate insulation layer through-hole and is connected to the first metal electrode so as to connect the second storage capacitor C2 in parallel to the first storage capacitor C1; and the second conductor electrode fills up the protection layer through-hole and the second etch stop layer through-hole and is connected to the first conductor electrode so as to connect the third storage capacitor C3 in parallel to the second storage capacitor C2;

wherein the first and second storage capacitors each comprise an electrode formed of a metal and an opposite electrode formed of an N type doped oxide semiconductor.

9. The TFT substrate as claimed in claim 8, wherein the first conductor electrode comprises an N type doped indium gallium zinc oxide (IGZO) conductor electrode and the second conductor electrode comprises an indium tin oxide (ITO) conductor electrode or an indium zinc oxide (IZO) conductor electrode.

10. The TFT substrate as claimed in claim 8 further comprising: a gate terminal that is located on the same layer as the first metal electrode, an oxide semiconductor layer that is located on the same layer as the first conductor electrode, source/drain terminals that are located on the same layer as the second metal electrode, and a pixel electrode that is located on the same layer as the second conductor electrode; the source/drain terminals are connected to the oxide semiconductor layer; the oxide semiconductor layer comprises an IGZO oxide semiconductor layer and the pixel electrode comprises an ITO pixel electrode or an IZO pixel electrode.

11. A thin-film transistor (TFT) substrate, comprising a substrate, a first metal electrode arranged on the substrate, a gate insulation layer arranged on the first metal electrode, a first conductor electrode formed of an N type doped oxide semiconductor and arranged on the gate insulation layer, an etch stop layer arranged on the first conductor electrode, a second metal electrode arranged on the etch stop layer, a protection layer arranged on the second metal electrode, and a second conductor electrode arranged on the protection layer, wherein the first metal electrode, the first conductor electrode, and the gate insulation layer interposed therebetween constitute a first storage capacitor C1; the first conductor electrode, the second metal electrode, and the etch stop layer interposed therebetween constitute a second storage capacitor C2; and the second metal electrode, the second conductor electrode, and the protection layer interposed therebetween constitute a third storage capacitor C3; the gate insulation layer comprises a gate insulation layer through-hole; the etch stop layer comprises a first etch stop layer through-hole and a second etch stop layer through-hole; the protection layer comprises a protection layer through-hole; the first etch stop layer through-hole is connected to and in communication with the gate insulation layer through-hole; the protection layer through-hole is connected to and in communication with the second etch stop layer through-hole; the second metal electrode fills up the first etch stop layer through-hole and the gate insulation layer through-hole and is connected to the first metal electrode so as to connect the second storage capacitor C2 in parallel to the first storage capacitor C1; and the second conductor electrode fills up the protection layer through-hole and the second etch stop layer through-hole and is connected to the first conductor electrode so as to connect the third storage capacitor C3 in parallel to the second storage capacitor C2;

wherein the first and second storage capacitors each comprise an electrode formed of a metal and an opposite electrode formed of an N type doped oxide semiconductor;

wherein the first conductor electrode comprises an N type doped indium gallium zinc oxide (IGZO) conductor electrode and the second conductor electrode comprises an indium tin oxide (ITO) conductor electrode or an indium zinc oxide (IZO) conductor electrode; and wherein the TFT substrate further comprises: a gate terminal that is located on the same layer as the first metal electrode, an oxide semiconductor layer that is located on the same layer as the first conductor electrode, source/drain terminals that are located on the same layer as the second metal electrode, and a pixel electrode that is located on the same layer as the second conductor electrode; the source/drain terminals are connected to the oxide semiconductor layer; the oxide semiconductor layer comprises an IGZO oxide semiconductor layer and the pixel electrode comprises an ITO pixel electrode or an IZO pixel electrode.

* * * * *